(12) United States Patent
Li

(10) Patent No.: US 10,483,245 B2
(45) Date of Patent: Nov. 19, 2019

(54) LIGHT BAR, EDGE-TYPE BACKLIGHT MODULE AND DISPLAY DEVICE

(71) Applicants: BOE TECHNOLOGY GROUP CO., LTD., Beijing (CN); BEIJING BOE CHATANI ELECTRONICS CO., LTD., Beijing (CN)

(72) Inventor: Wenjun Li, Beijing (CN)

(73) Assignees: BOE TECHNOLOGY GROUP CO., LTD., Beijing (CN); BEIJING ROE CHATANI ELECTRONICS CO., LTD., Beijing (CN)

(*) Notice: Subject to any disclaimer, the term of this patent is extended or adjusted under 35 U.S.C. 154(b) by 0 days.

(21) Appl. No.: 15/743,110

(22) PCT Filed: Aug. 9, 2017

(86) PCT No.: PCT/CN2017/096522
§ 371 (c)(1),
(2) Date: Jan. 9, 2018

(87) PCT Pub. No.: WO2018/082360
PCT Pub. Date: May 11, 2018

(65) Prior Publication Data
US 2019/0103383 A1    Apr. 4, 2019

(30) Foreign Application Priority Data
Nov. 2, 2016    (CN) ............ 2016 2 1169497

(51) Int. Cl.
*H01L 25/075*    (2006.01)
*F21S 4/28*    (2016.01)
(Continued)

(52) U.S. Cl.
CPC ............ *H01L 25/0753* (2013.01); *F21S 4/28* (2016.01); *G02B 6/0068* (2013.01);
(Continued)

(58) Field of Classification Search
None
See application file for complete search history.

(56) References Cited

U.S. PATENT DOCUMENTS

2008/0062715 A1* 3/2008 Park ................... G02B 6/003
362/612
2009/0246897 A1 10/2009 Wang et al.
(Continued)

FOREIGN PATENT DOCUMENTS

| CN | 201226357 Y | 4/2009 |
| CN | 202195349 U | 4/2012 |

(Continued)

OTHER PUBLICATIONS

International Search Report and Written Opinion dated Nov. 1, 2017; PCT/CN2017/096522.

*Primary Examiner* — Elmito Breval

(57) ABSTRACT

A light bar, an edge-type backlight module and a display device. The light bar includes a circuit board and an integrated light emitting body arranged on the circuit board, wherein the integrated light emitting body includes a package and a plurality of light sources, and the package is configured to package the plurality of light sources.

19 Claims, 2 Drawing Sheets

(51) Int. Cl.
    *H01L 33/60* (2010.01)
    *F21V 8/00* (2006.01)
    *F21Y 103/10* (2016.01)
    *F21Y 115/10* (2016.01)
    *H01L 33/62* (2010.01)

(52) U.S. Cl.
    CPC ......... *G02B 6/0073* (2013.01); *G02B 6/0083* (2013.01); *H01L 33/60* (2013.01); *F21Y 2103/10* (2016.08); *F21Y 2115/10* (2016.08); *H01L 33/62* (2013.01)

(56) References Cited

U.S. PATENT DOCUMENTS

2011/0051411 A1* 3/2011 Kim ................. G02F 1/133603
                                                        362/235
2013/0044511 A1* 2/2013 Motooka ............. G02B 6/0013
                                                        362/606
2014/0092625 A1* 4/2014 Lin ........................ G02B 6/005
                                                        362/606
2014/0240639 A1* 8/2014 Jung ................. G02F 1/133615
                                                        349/60
2015/0173198 A1* 6/2015 Jung ................... G02B 6/0073
                                                        349/65
2016/0187558 A1* 6/2016 Jung ..................... G02B 6/009
                                                        349/65
2016/0187567 A1    6/2016 Zhou

FOREIGN PATENT DOCUMENTS

CN      104566023 A      4/2015
CN      204513157 U      7/2015
CN      206112628 U      4/2017

* cited by examiner

LIGHT BAR, EDGE-TYPE BACKLIGHT MODULE AND DISPLAY DEVICE

CROSS REFERENCE OF THE RELATED APPLICATION

The present application claims priority to the Chinese Patent Application No. 201621169497.0 filed on Nov. 2, 2016, the entire disclosure of which is incorporated herein by reference as part of the present application.

TECHNICAL FIELD

The present disclosure relates to a light bar, an edge-type backlight module and a display device.

BACKGROUND

With the rapid development of the display technology, a technology of narrow bezel and wide viewing angle has become the mainstream development trend of the display panel. The technology of narrow bezel and wide viewing angle can bring a better visual experience to an user. In a structure of a current electronic device, an LED (Light Emitting Diode) that is used as a light source is a point light source, and a light mixing distance between the LEDs is relatively long, at least more than 2.5 mm, which cause a light incident distance of a backlight module being more than 2.8 mm, thus hampering the maximization of a viewable region of the electronic device, and limiting the development of narrow bezel technology.

SUMMARY

At least one embodiment of the present disclosure provides a light bar, the light bar comprises a circuit board and an integrated light emitting body that is arranged on the circuit board; wherein the integrated light emitting body comprises a package and a plurality of light sources, and the package is configured to package the plurality of light sources.

For example, in the light bar provided by at least one embodiment of the present disclosure, a material of the package is a light permeable material.

For example, in the light bar provided by at least one embodiment of the present disclosure, the plurality of light sources are connected in parallel or in series.

For example, in the light bar provided by at least one embodiment of the present disclosure, the light source is an LED, and a plurality of LEDs are packaged in a direct package way.

For example, in the light bar provided by at least one embodiment of the present disclosure, a light emitting surface of the integrated light emitting body is perpendicular to the circuit board, a distance between the light emitting surface and an edge of the circuit board that is close to the light emitting surface is W1, and 0.3 mm≤W1≤1.0 mm.

For example, in the light bar provided by at least one embodiment of the present disclosure, in a length direction of the circuit board, a distance between an edge of the integrated light emitting board and a close edge of the circuit board is L1, and L1>0.5 mm.

For example, in the light bar provided by at least one embodiment of the present disclosure, the integrated light emitting body is fixedly connected with the circuit board through a pad, and a radius of the pad R≤0.3 mm.

For example, in the light bar provided by at least one embodiment of the present disclosure, a thickness of the circuit board is D1, and 0.06 mm≤D1≤0.12 mm.

For example, in the light bar provided by at least one embodiment of the present disclosure, a thickness of the integrated light emitting body is D2, and 0.3 mm≤D2≤0.6 mm.

At least one embodiment of the present disclosure provides an edge-type backlight module, the edge-type backlight module comprises any one of the above light bars.

For example, the edge-type backlight module provided by at least one embodiment of the present disclosure further comprises a light guide plate, wherein the light guide plate is arranged on a side of a light emitting surface of the light bar, and the circuit board is arranged on the light guide plate.

For example, in the edge-type backlight module provided by at least one embodiment of the present disclosure, the light bar is fixed to the light guide plate by a glue that is arranged on a main surface of the circuit board, the glue covers the light bar and exposes the integrated light emitting body.

For example, in the edge-type backlight module provided by at least one embodiment of the present disclosure, in a width direction of the light bar, the glue exceeds a side edge of the light bar.

For example, in the edge-type backlight module provided by at least one embodiment of the present disclosure, the width of the glue exceeding the edge of the light bar is W2, and 0.25 mm≤W2≤1.0 mm.

For example, at least one embodiment of the present disclosure provides an edge-type backlight module, the edge-type backlight module further comprises an optical film that is arranged on a light exit side of the light guide plate, and the optical film overlaps the side edge that exceeds the light bar of the glue.

For example, in the edge-type backlight module provided by at least one embodiment of the present disclosure, a thickness of the glue is D3, and 0.03 mm≤D3≤0.06 mm.

For example, in the edge-type backlight module provided by at least one embodiment of the present disclosure, a gap between the glue and the integrated light emitting body is W3, and 0.1 mm≤W3≤0.15 mm.

For example, at least one embodiment of the present disclosure provides an edge-type backlight module, the edge-type backlight module further comprises a light shielding tape, wherein the light shielding tape is arranged on a back surface of the circuit board of the light bar and extends from an edge of the circuit board onto the light guide plate.

For example, in the edge-type backlight module provided by at least one embodiment of the present disclosure, a distance between a light exit surface of the light bar and an edge of the light shielding tape on the light guide plate is K, and 0.8 mm≤K≤2.0 mm.

At least one embodiment of the present disclosure provides a display device, the display device comprises any one of the above edge-type backlight modules.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
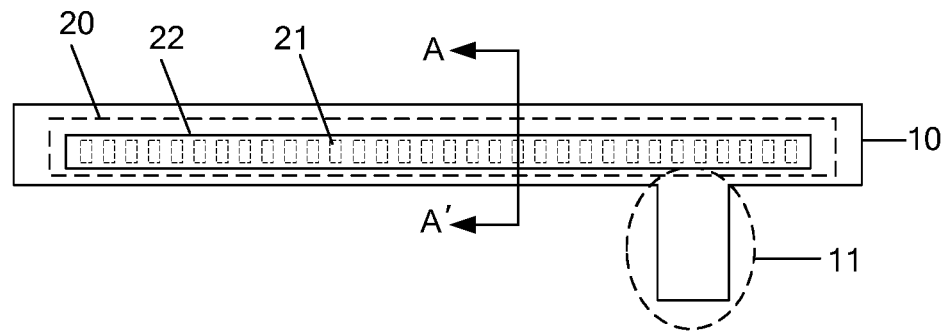
FIG. 1 is a structure schematic diagram of a light bar in an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

It should be noted that shapes and sizes of components in the drawings do not reflect the true scale, and merely intend to illustrate the content of the present disclosure.

Figure 2:
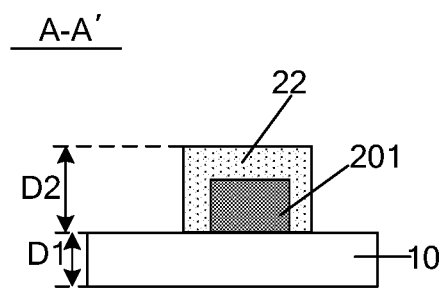
FIG. 2 is a cross-section view of the light bar in FIG. 1 along a AA' direction.

An embodiment of the present disclosure provides a light bar, for example, FIG. 1 is a structure schematic diagram of the light bar in an embodiment of the present disclosure; FIG. 2 is a cross-section view of the light bar in FIG. 1 along a AA' direction. As illustrated in FIG. 1 and FIG. 2, the light bar comprises a circuit board 10 and an integrated light emitting body 20 that is arranged on the circuit board 10; the integrated light emitting body 20 comprises a package 22 and a plurality of light sources 21, and the package 22 is configured to package the plurality of light sources 21, for example, the light sources 21 are packaged integrally.

For example, a material of the package 22 is a light transmittable material, for example, transparent glass, transparent resin and transparent plastic and so on.

For example, the circuit board 10 is configured to provide a signal to the light source 21 to make the light source 21 emit light. Considering that a flexible printed circuit (FPC) has characteristics of small volume, light weight, being bended freely and so on, the circuit board 10 is, for example, an FPC.

A dashed-line frame portion in FIG. 1 is a wire 11 that is extended from the circuit board 10. For example, the wire 11 is electrically connected to the light source 21 and connected to an external device.

In at least some embodiments, the plurality of light sources 21 may be connected in parallel or in series, which is not limited herein. For example, the light source is an LED, and a plurality of LEDs are packaged in a direct package way.

The light source 21 is, for example, a light emitting bare chip, and on this basis, the integrated light emitting body 20 may be obtained by integrally packaging a plurality of light emitting bare chips.

In at least some embodiments, a length of the integrated light emitting body 20 is less than a length of the circuit board 10, and a width of the integrated light emitting body 20 is less than a width of the circuit board 10. On this basis, the length and width of the integrated light emitting body 20, as well as the length and width of the circuit board 10 may be selected according to an apparatus to which the light bar is actually applied.

For example, when the light bar is used in a backlight module of a mobile phone, because the backlight module of the mobile phone generally adopts an edge-type backlight module, the length of the circuit board 10 is related to a length of the mobile phone. The width of the circuit board 10 may range from 2.0 mm to 2.8 mm, for example, about 2.2 mm, 2.3 mm, 2.4 mm, 2.8 mm and so on; correspondingly, the width of the integrated light emitting body 20 may range from 0.5 mm to 0.8 mm, for example, about 0.5 mm, 0.6 mm, 0.7 mm, 0.8 mm, and so on.

As illustrated in FIG. 2, a thickness D1 of the circuit board 10 may be controlled to range from 0.06 mm to 0.12 mm, for example, be about 0.06 mm, 0.08 mm, 0.09 mm, 0.10 mm, 0.12 mm and so on.

For example, a thickness of the integrated light emitting body 20 is related to a thickness of the light source 21. The thickness D2 of the integrated light emitting body 20 may be controlled to range from 0.3 mm to 0.6 mm, for example, be about 0.3 mm, 0.4 mm, 0.5 mm, 0.6 mm and so on. Based on this, when selecting the light source 21, the light source 21 with a small thickness may be selected.

At present, the light bar comprises a plurality of point light sources, and a light mixing distance between the point light sources is 2.5 mm at least, which is unfavorable for the narrow bezel design. In the light bar provided in the embodiment of the present disclosure, the plurality of light sources 21 are packaged by the package 22 to obtain the integrated light emitting body 20, so that light beams emitted by the integrated light emitting body 20 are more denser, and the light mixing distance of the integrated light emitting body 20 is reduced, therefore, the light incident distance of the backlight module can be reduced, which is favorable for obtaining a backlight module structure with super-short light incident distance, thus a viewable region of the display device can be increased and the narrow bezel design of the display device can be realized.

Figure 3:
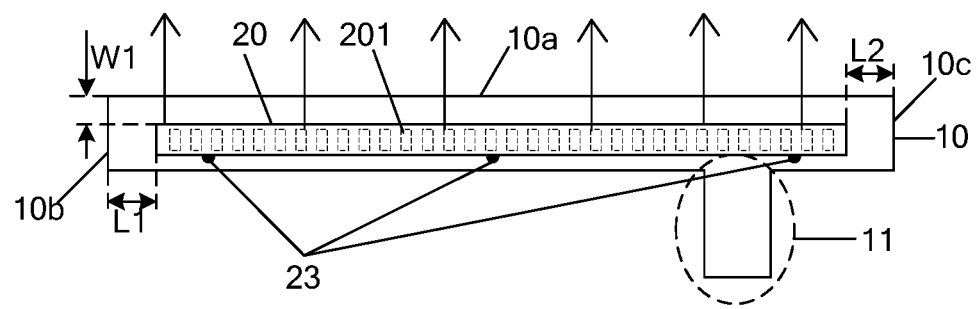
FIG. 3 is a structure schematic diagram of a light bar in an embodiment of the present disclosure.

For example, FIG. 3 is a structure schematic diagram of a light bar in an embodiment of the present disclosure. Considering that a LED (Light Emitting Diode) has advantages of high brightness, low heat, low energy consumption and long service life, and a thickness of the LED may be less than 0.3 mm, therefore, as illustrated in FIG. 3, the light source 21 may be LED 201 and a plurality of LEDs 201 are packaged by a way of COB (Chip On Board).

For example, the LED 201 may be an LED bare chip.

For example, a plurality of LEDs 201 are packaged by a way of COB, this package way comprises: a plurality of LEDs 201 are welded on a substrate by a welding technique, and then the substrate with a plurality of LEDs 201 welded is integratedly packaged by a COB integrated packaging technique, and the integrated light emitting body 20 that is illustrated in FIG. 3 may be obtained. On this basis, the substrate is welded on the circuit board 10.

For example, the substrate is a metal substrate, and a material of the metal substrate is, for example, aluminum alloy or copper alloy. Due to the conductivity of the metal, on the one hand, the circuit board 10 may drive the integrated light emitting body 20 to emit light, on the other hand, the metal substrate can be favorable for the heat dissipation of the light bar, therefore improving the service life of the light bar.

In the embodiment of the present disclosure, the plurality of LEDs 201 are packaged by a way of COB, so that the light mixing distance of the integrated light emitting body 20 can range from 0.5 mm to 1.5 mm, for example, be about 0.5 mm, 0.7 mm, 0.9 mm, 1.2 mm, 1.5 mm and so on, which is favorable for obtaining a backlight module structure with super-short light incident distance, and adopting the COB package way can ensure the light emitting property of the light bar.

For example, as illustrated in FIG. 3, a light emitting surface (for example, a surface from which light exits in FIG. 3) of the integrated light emitting body 20 is perpendicular to the circuit board 10; a distance between the light emitting surface to an upper edge 10*a* of the circuit board 10 that is close to the light emitting surface is W1, and 0.3 mm≤W1≤1.0 mm, for example, W1 is about 0.3 mm, 0.5 mm, 0.7 mm, 0.9 mm, 1.0 mm and so on.

For example, when the light bar is used in an edge-type backlight module structure, for example, the light bar may be fixed on a light guide plate, in this case, if the distance W1 between the light emitting surface and the upper edge 10*a* of the circuit board 10 that is close to the light emitting surface is too short, it is easy to lead to the uptight fixing of the light guide plate and the light bar, resulting in detachment of the light guide plate; if W1 is too long, a large lighting loss of LED 201 may be caused, therefore the range of W1 is selected as 0.3 mm≤W1≤1.0 mm.

For example, the range of W1 may also be selected as 0.3 mm≤W1≤0.6 mm.

For example, as illustrated in FIG. 3, along a length direction of the circuit board 10, a distance between a left edge of the integrated light emitting body 20 and a left edge 10*b* of a closed circuit board 10 is L1, for example, L1>0.5 mm. Obviously, the length of L1 cannot be too long, for example, the length of L1 is less than ¹/₁₀ of the length of the circuit board.

For example, as illustrated in FIG. 3, a distance between a right edge of the integrated light emitting body 20 and a right edge 10*c* of the circuit board 10 is L2, the distance between the left edge of the integrated light emitter 20 and the left edge of the circuit board 10 is L1, and L1 may be equal to or not equal to L2. In the embodiment of the present disclosure, the illustration is made by taking L1 being equal to L2 as an example.

When the light bar is used in an edge-type backlight module structure, for example, two ends of the circuit board 10 may be fixed to the light guide plate of the backlight module along the length direction of the circuit board 10, at this time, enough area is left at the two ends of circuit board 10 along its length direction. Due to the width of the circuit board 10 is small, L1 is set to be sufficiently large along the length direction of the circuit board 10. Through testing, it is found that L1>0.5 mm may satisfy the fixing of the light bar and the light guide plate structure of the backlight module. For example, the length of L1 is about 0.5 min, 0.6 min, 0.8 mm and so on.

As illustrated in FIG. 3, the integrated light emitting body 20 is fixedly connected to the circuit board 10 through a pad 23. In this case, if a radius of the pad 23 is too large, the light incident distance is increased correspondingly. Therefore, the radius of the pad 23 may be selected as R≤0.3 mm. For example, the radius R of the pad 23 is about 0.2 mm, 0.25 mm, 0.3 mm and so on.

It should be noted that the number of the pads is not limited, as long as the integrated light emitting body 20 can be fixed on the circuit board 10.

At least one embodiment of the present disclosure further provides an edge-type backlight module, the edge-type backlight module comprises any one of the above light bars.

Figure 4:
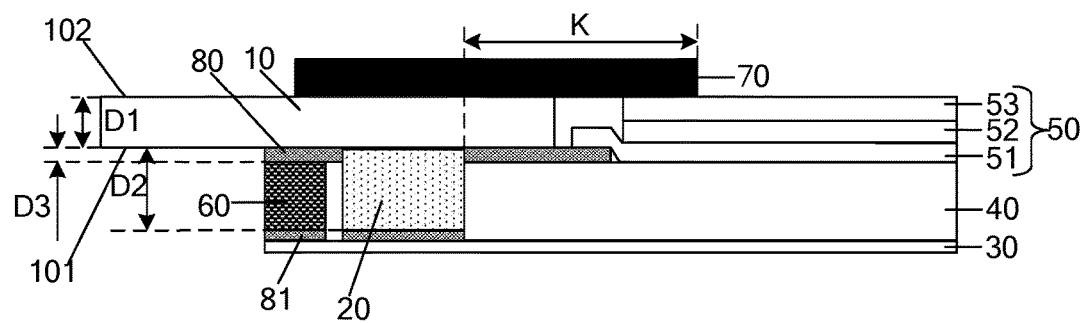
FIG. 4 is a structure schematic diagram of a edge-type backlight module in an embodiment of the present disclosure.

For example, FIG. 4 is a structure schematic diagram of an edge-type backlight module in an embodiment of the present disclosure. As illustrated in FIG. 4, the edge-type backlight module further comprises a light guide plate 40, the light guide plate 40 is arranged on a side (for example, a light exit surface) of a main surface 101 of the light bar. The light bar is fixed to the light guide plate 40 through a glue 80. For example, the glue 80 covers the light bar and exposes the integrated light emitting body 20.

Figure 5:
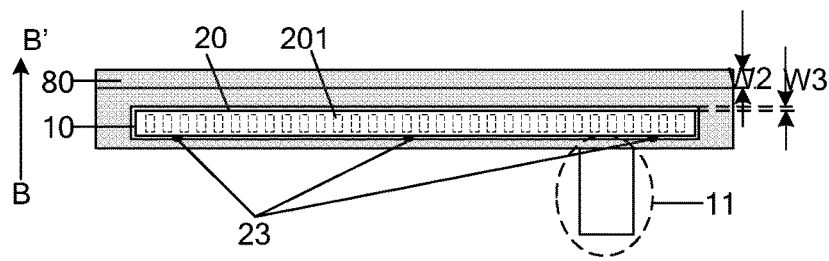
FIG. 5 is a schematic diagram of a glue being arranged on a light bar in an embodiment of the present disclosure.

For example, FIG. 5 is a schematic diagram of the glue being arranged on a light bar in an embodiment of the present disclosure. For example, as illustrated in FIG. 5, in a side of the main surface 101 of the light bar, namely a side of the light exit surface, an edge of the glue 80 that covers the light bar may exceed the light bar.

Figure 6:
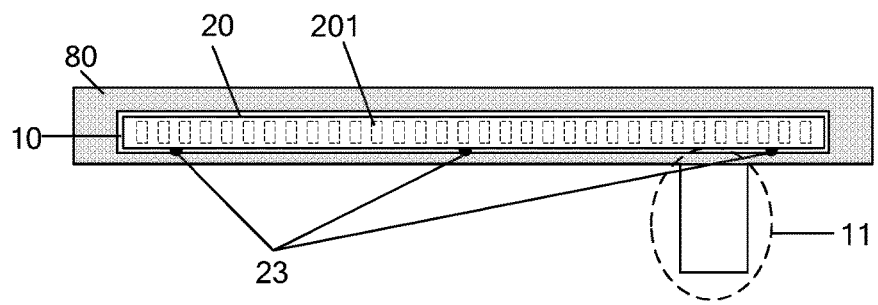
FIG. 6 is schematic diagram of a glue being arranged on a light bar in another embodiment of the present disclosure.

For example, FIG. 6 is a schematic diagram of the glue being arranged on a light bar in another embodiment of the present disclosure. As illustrated in FIG. 6, the edge of the glue 80 that covers the light bar may also not exceed the light bar, as long as the light bar is fixed to the light guide plate 40.

For example, the glue 80 is also used to fix the light bar and a glue frame 60, except for being used to fix the light bar and the light guide plate 40, as illustrated in FIG. 4.

In the embodiment of the present disclosure, the glue 80 covers a part of the main surface 101 of the light bar and exposes the integrated light emitting body 20, on the one hand, which can make the light bar to be fixed with the structures, such as the light guide plate 40 and so on, of the backlight module, and on the other hand, which can avoid the adverse effect on the light emitting due to the glue 80 covering the integrated light emitting body 20.

For example, as illustrated in FIG. 5, a gap W3 between the glue 80 and the integrated light emitting body 20 ranges from 0.1 mm to 0.15 mm, for example, W3 is about 0.1 mm, 0.12 mm, 0.13 mm, 0.15 mm or other values, this arrangement can avoid the glue 80 thermally expanding due to the heat that is generated by the integrated light emitting body 20 when the glue 80 and the integrated light emitting body 20 are too close.

For example, as illustrated in FIG. 4, if a thickness D3 of the glue 80 is too large, the light emitted by the integrated light emitting body 20 is shielded; if the thickness D3 of the glue 80 is too small, the fixing effect is not good. Therefore, the thickness D3 of the glue 80 may be selected to range from 0.03 mm to 0.06 mm. For example, the thickness D3 of the glue 80 may be about 0.03 mm, 0.04 mm, 0.05 mm or other values.

For example, as illustrated in FIG. 4, the edge-type backlight module further comprises an optical film 50 that is arranged on a light emitting side of the light guide plate 40, as illustrated in FIG. 5, in a width direction of the light bar, namely a direction of BB', the glue 80 exceeds a side edge of the light bar, the optical film 50 overlaps a portion that exceeds the light bar of the glue 80. A width of the glue 80 exceeding the edge of the light bar is W2, and 0.25 mm≤W2≤1.0 mm, such as about 0.25 mm, 0.3 mm, 0.5 mm, 1.0 mm and so on. For example, a range of W2 may also be 0.25 mm≤W2≤0.4 mm.

For example, the optical film 50 may comprise a diffusion sheet 51, a lower prism 52 and an upper prism 53 that are sequentially arranged on the light guide plate 40. The diffusion sheet 51 may overlap the portion that exceeds the light bar of the glue 80.

For example, in order to prevent the edge-type backlight module from warping caused by the extrusion between the light bar and the optical film 50 resulted from the thermal expansion of the light bar, there is a certain gap between the optical film 50 and the light bar, and a width of the gap may be about 0.2 mm.

For example, in the embodiment of the present disclosure, a width of the glue 80 exceeding an edge of the light bar is W2, and 0.25 mm≤W2≤1.0 mm, on the one hand, it can ensure that a gap between the optical film 50 and the light bar is reserved on the basis of overlapping between the optical film 50 and the glue 80, and on the other hand, the problem that the light loss is too large due to W2 being too large can be avoided.

For example, as illustrated in FIG. 4, the edge-type backlight module further comprises a light shielding tape 70 which is arranged above the circuit board 10 of the light bar and extending from an edge of the circuit board 10 onto the light guide plate 40. A distance between the light emitting surface of the light bar and an edge of the light shielding tape 70 above the light guide plate 40 is K, for example, 0.8 mm≤K≤2.0 mm. For example, the distance between the light emitting surface of the light bar and the edge of the light shielding tape 70 above the light guide plate 40 may be about 0.8 mm, 0.9 mm, 1.0 mm, 1.1 mm, 1.2 mm and so on. For example, the distance between the light emitting surface of the light bar and the edge of the light shielding tape 70 above the light guide plate 40 may also be in the range of 0.8 mm≤K≤1.0 mm.

For example, on the one hand, the light shielding tape 70 can shield the light from a part of the light emitting surface of the backlight module with nonuniform brightness, so as to make the light be emitted out uniformly on the display region of the display device; on the other hand, the light shielding tape 70 can also fix the optical film 50.

For example, in the embodiment of the present disclosure, the light incident distance of the edge-type backlight module may reach about 0.8 mm under the limit condition. As compared with a current edge-type backlight module, the light incident distance may be reduced by 2 mm at maximum, and a corresponding viewable region can be increased by 2 mm.

For example, as illustrated in FIG. 4, the edge-type backlight module further comprises a reflection sheet 30, the reflection sheet 30 is arranged on a side opposite to the light emitting side of the light guide plate 40, wherein the reflection sheet 30 is fixed with the light bar and the glue frame 60 through a reflection sheet glue 81.

The embodiment of the present disclosure can improve the light utilization efficiency by arranging the reflection sheet 30.

At least one embodiment of the present disclosure further provides a display device, the display device comprise any one of the above edge-type backlight modules.

For example, in the light bar of the display device, the plurality of light sources 21 are packaged by the package 22 to obtain the integrated light emitting body 20, so that light beams emitted by the integrated light emitting body 20 are more denser, the light mixing distance of the integrated light emitting body 20 is reduced, therefore the light incident distance of the edge-type backlight module can be reduced, which is favorable for achieving the backlight module structure with a super-short light incident distance, and the viewable region of the display device is enlarged, so as to realize the narrow bezel structure of the display device.

For example, the display device may be any product or component with a display function, such as an OLED panel, a cell phone, a tablet, a television, a display, a notebook computer, a digital photo frame, a navigator and so on.

For example, the light bar, the edge-type backlight module and the display device provided by the embodiments of the present disclosure have at least one of the following technical effects:

(1) The light bar provided by at least one embodiment of the present disclosure can reduce the light mixing distance of the edge-type backlight module, therefore the light incident distance of the backlight module is reduced and the viewable region of the display device is increased.

(2) The edge-type backlight module provided by at least one embodiment of the present disclosure can reduce the light incident distance of the backlight module, which is favorable for obtaining the backlight module structure with a super-short light incident distance, the viewable region of the display device is increased, and therefore a narrow bezel structure of the display device can be realized.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

What are described above is related to the specific embodiments of the disclosure only and not limitative to the scope of the disclosure. The protection scope of the disclosure shall be based on the protection scope of the claims.

What is claimed is:

1. A light bar, comprising: a circuit board and an integrated light emitting body arranged on the circuit board,
    wherein the integrated light emitting body comprises a package and a plurality of light sources, and the package is configured to package the plurality of light sources,
    wherein a light emitting surface of the integrated light emitting body is perpendicular to a surface of the circuit board on which the integrated light emitting body is mounted, a distance between the light emitting surface and an edge of the surface of the circuit beard on which the integrated light emitting body is mounted, close to the light emitting surface and parallel to the light emitting surface is W1, and 0.3 mm≤W1≤1.0 mm.

2. The light bar according to claim 1, wherein a material of the package is a light permeable material.

3. The light bar according to claim 1, wherein the plurality of light sources are connected in parallel or in series.

4. The light bar according to claim 1, wherein the light source is an LED, and a plurality of LEDs are packaged in a direct package way.

5. The light bar according to claim 1, wherein along a length direction of the circuit board, a distance between an edge of the integrated light emitting board and a close edge of the circuit board is L1, and L1>0.5 mm.

6. The light bar according to claim 1, wherein the integrated light emitting body is fixedly connected with the circuit board through a pad, and a radius of the pad R≤0.3 mm.

7. The light bar according to claim 1, wherein a thickness of the circuit board is D1, and 0.06 mm≤D1≤0.12 mm.

8. The light bar according to claim 1, wherein a thickness of the integrated light emitting body is D2, and 0.3 mm≤D2≤0.6 mm.

9. An edge-type backlight module, comprising the light bar according to claim 1.

10. The edge-type backlight module according to claim 9, further comprising a light guide plate, wherein the light guide plate is arranged on a light emitting surface side of the light bar, and the circuit board is arranged on the light guide plate.

11. The edge-type backlight module according to claim 10, wherein the light bar is fixed to the light guide plate by a glue arranged on a main surface of the circuit board, the glue covers the light bar and exposes the integrated light emitting body.

12. The edge-type backlight module according to claim 11, wherein along a width direction of the light bar, the glue exceeds a side edge of the light bar.

13. The edge-type backlight module according to claim 12, wherein the width of the glue exceeding the edge of the light bar is W2, and 0.25 mm≤W2≤1.0 mm.

14. The edge-type backlight module according to claim 11, further comprising an optical film arranged on a light exit side of the light guide plate, and the optical film overlaps the side edge that exceeds the light bar of the glue.

15. The edge-type backlight module according to claim 11, wherein a thickness of the glue is D3, and 0.03 mm≤D3≤0.06 mm.

16. The edge-type backlight module according to claim 15, wherein a gap between the glue and the integrated light emitting body is W3, and 0.1 mm≤W3≤0.15 mm.

17. The edge-type backlight module according to claim 9, further comprising a light shielding tape, wherein the light shielding tape is arranged on a back surface of the circuit board of the light bar and extends from an edge of the circuit board onto the light guide plate.

18. The edge-type backlight module according to claim 17, wherein a distance between a light exit surface of the light bar and an edge of the light shielding tape on the light guide plate is K, and 0.8 mm≤K≤2.0 mm.

19. A display device, comprising the edge-type backlight module according to claim 9.

* * * * *